United States Patent
Pombo et al.

(10) Patent No.: US 11,506,905 B2
(45) Date of Patent: Nov. 22, 2022

(54) HINGED HEAD-MOUNTED DISPLAY

(71) Applicant: RealWear, Inc., Vancouver, WA (US)

(72) Inventors: Stephen A. Pombo, Campbell, CA (US); Nima Lahijani Shams, San Jose, CA (US); George Henry Hines, San Francisco, CA (US)

(73) Assignee: RealWear, Inc., Vancouver, WA (US)

( * ) Notice: Subject to any disclaimer, the term of this patent is extended or adjusted under 35 U.S.C. 154(b) by 180 days.

(21) Appl. No.: 16/905,227

(22) Filed: Jun. 18, 2020

(65) Prior Publication Data

US 2020/0400960 A1 Dec. 24, 2020

Related U.S. Application Data

(60) Provisional application No. 62/864,790, filed on Jun. 21, 2019.

(51) Int. Cl.
*G02B 27/01* (2006.01)
*H05K 5/03* (2006.01)
*H05K 5/02* (2006.01)

(52) U.S. Cl.
CPC ....... *G02B 27/0176* (2013.01); *H05K 5/0226* (2013.01); *H05K 5/03* (2013.01); *G02B 2027/0154* (2013.01)

(58) Field of Classification Search
CPC ........ G02B 2027/0154; G02B 27/0176; H05K 5/0226
See application file for complete search history.

(56) References Cited

U.S. PATENT DOCUMENTS

| | | | |
|---|---|---|---|
| 5,880,773 A * | 3/1999 | Suzuki | G02B 27/04 348/121 |
| 6,424,321 B1 | 7/2002 | Ronzani et al. | |
| 8,605,008 B1 | 12/2013 | Prest et al. | |
| 8,777,406 B2 * | 7/2014 | Sugihara | G02C 9/04 351/158 |
| 9,841,603 B2 | 12/2017 | Halpin et al. | |
| 9,844,144 B1 | 12/2017 | Al-Momani et al. | |
| 2006/0109350 A1 | 5/2006 | Yeh | |

(Continued)

OTHER PUBLICATIONS

Non-Final Office Action dated Oct. 14, 2021 in U.S. Appl. No. 16/908,501, 20 pages.
Preinterview first Office Action dated Dec. 15, 2021 in U.S. Appl. No. 16/905,201, 04 pages.
International Preliminary Report on Patentability received for PCT Application No. PCT/US2020/03 9004, dated Dec. 30, 2021, 7 pages.

(Continued)

*Primary Examiner* — William Boddie
*Assistant Examiner* — Bipin Gyawali
(74) *Attorney, Agent, or Firm* — Shook, Hardy & Bacon, L.L.P.

(57) ABSTRACT

Systems and methods for a flexible, modular head-mounted display is provided. The head-mounted display system may comprise a base member and one or more arm members that are coupled to the base member. The arm member(s) may be coupled to the base member via a hinge system that allows the arm member(s) to move with respect to the base member. Interior walls of the hinge system may define a passage therethrough such that wiring may extend throughout the head-mounted display system. The head-mounted display system may further include a cover that encloses at least a portion of the hinge. The cover may overlap with the base member or the one or more arm members.

16 Claims, 15 Drawing Sheets

(56) References Cited

U.S. PATENT DOCUMENTS

| | | | |
|---|---|---|---|
| 2006/0119539 A1* | 6/2006 | Kato | G02B 27/0176 345/8 |
| 2009/0097688 A1 | 4/2009 | Lewis | |
| 2011/0089207 A1 | 4/2011 | Tricoukes et al. | |
| 2011/0213664 A1 | 9/2011 | Osterhout et al. | |
| 2012/0235896 A1 | 9/2012 | Jacobsen et al. | |
| 2012/0293407 A1 | 11/2012 | Lee | |
| 2013/0002559 A1 | 1/2013 | Vardi | |
| 2013/0090062 A1 | 4/2013 | Tricoukes et al. | |
| 2013/0176626 A1 | 7/2013 | Heinrich et al. | |
| 2013/0182396 A1* | 7/2013 | Hu | G06F 1/1681 16/302 |
| 2014/0244854 A1 | 8/2014 | Patel et al. | |
| 2016/0178903 A1 | 6/2016 | Nakajima | |
| 2016/0246059 A1* | 8/2016 | Halpin | G02B 27/0176 |
| 2016/0274662 A1 | 9/2016 | Rimon et al. | |
| 2017/0227774 A1 | 8/2017 | Cherdakov et al. | |
| 2017/0264987 A1 | 9/2017 | Hong et al. | |
| 2017/0317490 A1 | 11/2017 | Penny et al. | |
| 2018/0124497 A1 | 5/2018 | Boesen | |
| 2019/0075254 A1 | 3/2019 | Jhawar et al. | |
| 2019/0094981 A1 | 3/2019 | Bradski et al. | |
| 2019/0332566 A1 | 10/2019 | Yasunaka et al. | |
| 2020/0026349 A1* | 1/2020 | Fontanel | G06V 40/19 |
| 2020/0183190 A1 | 6/2020 | Rousseau et al. | |

OTHER PUBLICATIONS

International Preliminary Report on Patentability received for PCT Application No. PCT/US2020/038625, dated Dec. 30, 2021, 11 pages.

Piccardi, L., et al., "WearCam: A head mounted wireless camera for monitoring gaze attention and for the diagnosis of developmental disorders in young children", 16th IEEE International Conference on Robot & Human Interactive Communication, pp. 594-598 (Aug. 2007).

International Search Report and Written Opinion received for PCT Patent Application No. PCT/US2020/038625, dated Sep. 4, 2020, 13 pages.

International Search Report and Written Opinion received for PCT Patent Application No. PCT/US2020/039004, dated Oct. 9, 2020, 11 pages.

Final Office Action dated Feb. 9, 2022 in U.S. Appl. No. 16/908,501, 23 pages.

First Action Interview Office Action dated Mar. 4, 2022 in U.S. Appl. No. 16/905,201, 3 pages.

Non-Final Office Action dated May 16, 2022 in U.S. Appl. No. 16/908,501, 23 pages.

Notice of Allowance dated Jun. 23, 2022 in U.S. Appl. No. 16/905,127, 9 pages.

* cited by examiner

HINGED HEAD-MOUNTED DISPLAY

CROSS REFERENCE TO RELATED APPLICATIONS

This application claims the benefit of U.S. Provisional Application No. 62/864,790, filed Jun. 21, 2019, entitled "Head-Mounted Computing Device and Modular Peripherals for Head-Mounted Computing Device," which is incorporated by reference herein in its entirety.

BACKGROUND

Head-mounted displays are sometimes used to mount technology on or around a user's head, allowing the user to transport and use different technologies with greater ease and flexibility. Head-mounted displays generally utilize a head-wearable frame system to support a display component. In certain circumstances, these head-wearable frame systems are often ill-fitting and prone to breaking when dropped.

SUMMARY

This summary is intended to introduce a selection of concepts in a simplified form that are further described below in the detailed description section of this disclosure. This summary is not intended to identify key or essential features of the claimed subject matter, nor is it intended to be used as an aid in determining the scope of the claimed subject matter.

In brief, and at a high level, this disclosure describes, among other things, a head-mounted display system having a frame that includes modular components that are coupled together and are adjustable with respect to one another via a hinge system. The modular components may include a base member and one or more arm members. The arm members may move with respect to one another so as to allow the frame to be adjusted to a person's head and/or provide impact resistance when the frame is accidentally dropped.

The arm members may be pivotally coupled to the base member by the hinge system. The hinges of the hinge system provide an internal passage. The internal passage allows wiring to extend throughout the one or more arm members, the hinge, and the base member. The internal passage is maintained despite the one or more arm members moving with respect to the base member. To ensure that environmental elements do not enter the interior chambers of the head-mounted display system, the hinge system may further include a hinge cover that fits over the hinge.

In one embodiment of the present technology, a head-mounted display system is provided. The head-mounted display system comprises an arm member having a distal end and a proximal end. A display portion is coupled to the distal end of the arm member. A base member is pivotally coupled to the proximal end of the arm member by a hinge. The hinge comprises a first hinge member that mates with a second hinge member, the first hinge member having an interior wall structure defining a first passage extending therethrough, and the second hinge member having an interior wall structure defining a second passage extending therethrough, the second passage opening to the first passage. The head-mounted display system further comprises a biasing member for biasing the hinge to a first position.

In another embodiment of the present technology, a frame for a head-mounted display is provided. The frame comprises a base member including a first end and a second end. The frame also comprises a first arm member including a proximal end that is pivotally coupled to the first end of the base member. The frame further comprises a second arm member including a proximal end that is pivotally coupled to the second end of the base member. The frame additionally comprises a pair of hinges pivotally coupling the first arm member and the second arm member to the base member, each of the pair of hinges comprising a first hinge member that mates with a second hinge member. The first hinge member has an interior wall structure defining a first passage extending therethrough. The second hinge member has an interior wall structure defining a second passage extending therethrough, the second passage opening to the first passage. The frame further comprises a pair of biasing members for biasing the pair of hinges to a first position.

In a further embodiment of the present technology, a hinge for a head-mounted display frame is provided. The hinge comprises a first hinge member having a first pin housing. The hinge also comprises a second hinge member having a second pin housing, wherein the second pin housing mates with the first pin housing, the first pin housing and the second pin housing are configured to receive a pin. The first hinge member has an interior wall structure defining a first passage extending therethrough. The second hinge member has an interior wall structure defining a second passage extending therethrough, the second passage opening to the first passage. The hinge further comprising a biasing member for biasing the hinge to a first position.

BRIEF DESCRIPTION OF THE DRAWINGS

The present technology is described in detail herein with reference to the attached figures, which are exemplary and non-limiting in nature, wherein.

DETAILED DESCRIPTION

Figure 1A:
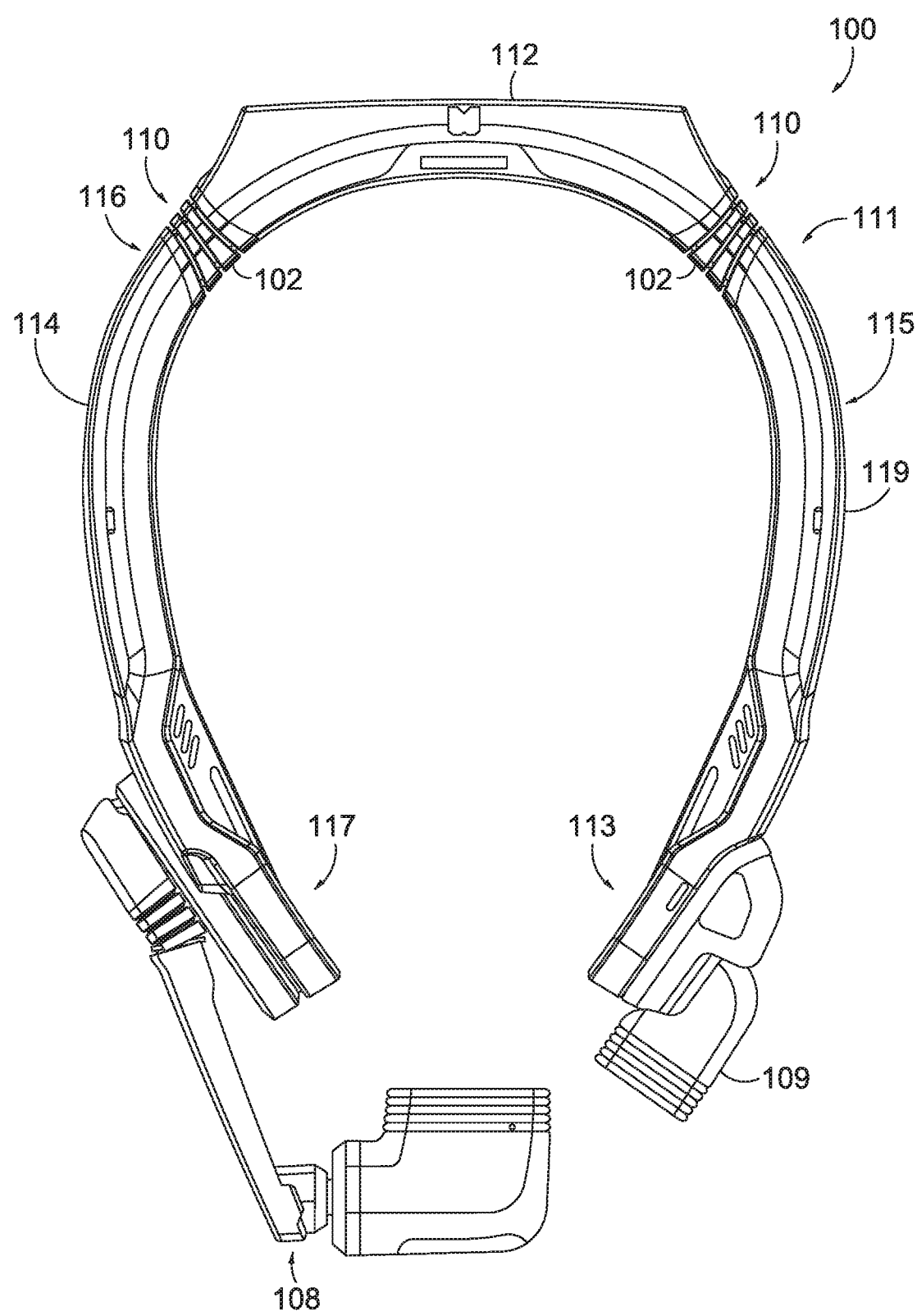
FIG. 1A is a top, plan view of an exemplary head-mounted display system, in accordance with an embodiment of the present technology.

The subject matter of the present technology is described with specificity in this disclosure to meet statutory requirements. However, this description is not intended to limit the scope hereof. Rather, the claimed subject matter may be embodied in other ways, to include different steps, combinations of steps, features, and/or combinations of features, similar to the ones described in this disclosure, in conjunction with other present or future technologies. Moreover, although the terms "step" and "block" may be used to identify different elements of methods employed, the terms should not be interpreted as implying any particular order among or between various steps or blocks unless and except when the order of individual steps or blocks is explicitly described and required.

At a high level, the present technology relates to a head-mounted display system, as well as components, configurations, and uses thereof. An exemplary head-mounted display system may include a selection of components, such as a base member and an arm member, in a modular configuration that can be coupled together to provide a frame for a head-worn display.

The arm member may be pivotally coupled to the base member via a hinge. The head-mounted display system may be worn such that the base member corresponds to the back of a user's head while one or more arm members extend toward the front of the user's head. A display component may be mounted at the end of the one or more arm members, for example, near the user's eye. The head-mounted display system may be a modular system such that the base member or arm member can be independently manufactured and later coupled together. The head-mounted display system may include different processors, circuits, or other electrical components located throughout the base member and the arm members. As such, the hinge may include an internal passageway for wiring to extend through the interior of the frame while an arm member moves with respect to the base member. This internal passageway is maintained despite the hinge moving, such as when a user adjusts the frame to fit their head or helmet size.

Among other advantages, aspects described herein provide a head-mounted display having greater flexibility, modularity, and impact resistance. The hinges may allow the frame to be flexed so as to fit different head or helmet sizes. For example, the head-mounted display system may be worn by different users during different manufacturing shifts. A first user may wear the head-mounted display during a first shift, and then a second user may wear the same head-mounted display during a second shift. The hinges allow the frame to be adjusted so as to fit different head or helmet sizes of the first and second users.

Additionally, the hinges may provide improved impact resistance. For instance, the head-mounted display system may be worn during activities where the user rotates her head, such as in sports or fixing difficult-to-reach machinery in industrial environments. It is not uncommon for the head-mounted display system to be accidently dropped during these activities. The hinge allows the arms to move with respect to the base member so that the frame can better absorb or distribute the impact force. In some aspects, the hinge may provide a tensioning element in the hinge to further dampen the impact force.

The head-mounted display system may also be a modular system, where components of the frame may be coupled or decoupled so as to swap out a particular component. The modularity of the head-mounted display system may improve manufacturing and assembly of the components. For example, the components may be manufactured separately, such as at different factories or at different times of the manufacturing processes, and then assembled together at a later time. Further, in the event that a component of the head-mounted display system breaks (e.g., an arm member, base member, or hinge), the component can be swapped out for a new component without replacing the entire frame.

Turning initially to FIG. 1A, a top, plan view of an exemplary head-mounted display system 100 is shown, in accordance with an embodiment of the present technology. The head-mounted display system 100 includes a base member 112 and one or more arm members 115, such as a first arm member 114 and a second arm member 119. First arm member 114 includes a first end 116 (also referred to as a proximal end) and a second end 117 (also referred to as a distal end). The first end 116 may be located proximate the base member 112. Second arm member 119 includes a first end 111 (also referred to as a proximal end) and a second end 113 (also referred to as a distal end). The first end 111 may be located proximate the base member 112. The one or more arm members 115 may extend away from the base member 112 and to the second ends 117 and 113.

In some aspects, the one or more arm members 115 and the base member 112 are modular components that may be coupled together. For instance, the first end 116 of the first arm member 115 may be coupled (and/or removable coupled) to the base member 112. Additionally or alternatively, the first end 111 of the second arm member 119 may be coupled (and/or removable coupled) to the base member 112. The modularity of the one or more arm members 115 and the base member 112 allows the arm members 115 and base member 112 to be manufactured separately. As such, the arm members 115 and base member 112 may be manufactured in different locations or at different times. Additionally, in the event that any of the modular components of the head-mounted display system 100 are damaged, the damaged component can be swapped out for a new component without replacing the entire head-mounted display system 100. It should be appreciated that each member itself (e.g., one or more arm members 115 and the base member 112) may be a single, integral component (e.g., formed through a molding process) or formed by multiple components that are coupled to each other to form the member.

The head-mounted display system 100 includes a display module 108. The display module 108 may be coupled to the second end 117 of the first arm member 114. As used in this disclosure, the term "display module" includes any component used with a head-mounted display that is configured to provide a display characteristic that is viewable to a user. A "display characteristic" includes any viewable characteristic, such as a display state (e.g., transparent, partially transparent, non-transparent, selectively transparent, interactive, text/image/video presenting, etc.), a display type (e.g., an optic, waveguide optic, digital display, micro display (e.g., a liquid crystal display (LCD), light-emitting diode (LED) display, organic light-emitting diode (OLED) display, digital light processing (DLP) display, etc.), or any combination thereof, etc.), a display configuration (e.g., one or multiple display portions of the same or different type, display portions at different angles, display portions in different arrangements, etc.), and/or technical specifications of the display portion (e.g., resolution, pixels per inch, size, parallax, contrast, color depth, refresh rate, etc.), in addition to other display characteristics. The preceding examples are intended to be exemplary and non-limiting.

The head-mounted display system 100 also includes one or more cameras 109. For instance, the one or more cameras 109 may be coupled to the second end 113 of the second arm member 119. By way of example, the one or more cameras 109 may be any image sensor capable of capturing an image data, such as a video camera or a depth camera, including stereoscopic camera systems, infrared camera systems, or RGB camera systems.

Figure 1B:
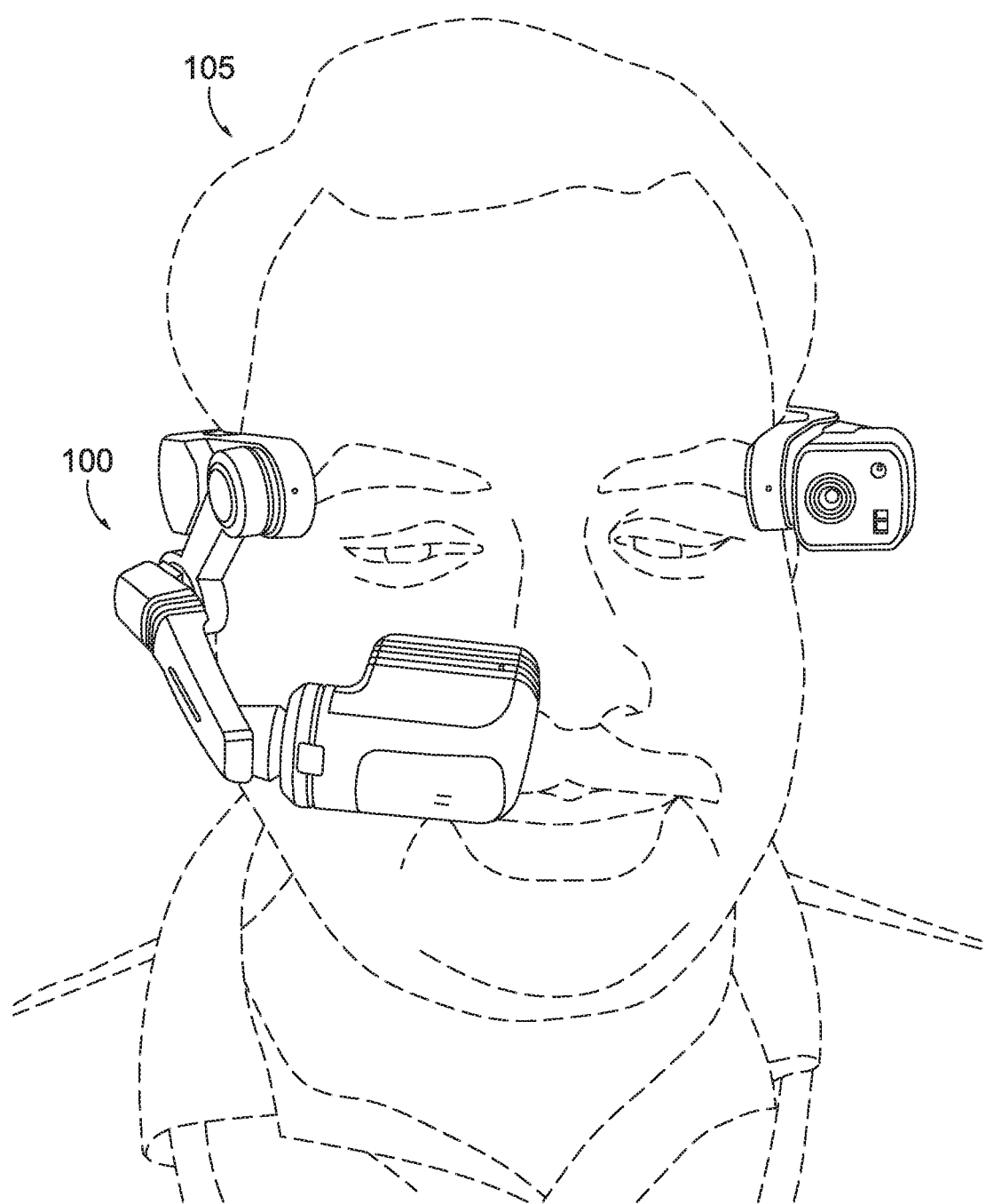
FIG. 1B illustrates an exemplary head-mounted display system worn by a user, in accordance with an embodiment of the present technology.

FIG. 1B illustrates a person 105 wearing the head-mounted display system 100. The head-mounted display system 100 may be configured to be worn on a user's head such that the display module 108 is positioned proximate to a user's eye. By way of example, in an as-worn configuration (i.e., when the head-mounted display system 100 is worn by the user 105), the base member 112 may be located proximate to the back of a user's head while the one or more arm members 115 may be located along the side of the user's head, adjacent the user's ears. It is contemplated that the head-mounted display system 100 may have different orientations or components and, thus, be worn differently.

It should be appreciated that the head-mounted display system 100 may be worn directly on the user's head or, alternatively, may be worn indirectly based on the head-mounted display system 100 being attached to a user's helmet or hat, or similar head-worn apparel. While not shown, the head-mounted display system 100 may be coupled to a head-worn apparel via one or more attachment mechanisms, such as clips, straps, buckles, and the like.

Returning to FIG. 1A, the head-mounted display system 100 includes one or more hinges 110. The one or more hinges 110 may couple the one or more arm members 115 to the base member 112. The one or more hinges 110 include a hinge cover 102. As discussed in greater detail herein, the hinge cover 102 may be configured to fit over the one or more hinges 110 to prevent external elements (e.g., dust or moisture) from entering the head-mounted display system.

In general, the hinge 110 couples the first end 116 of the first arm member 114 to the base member 112. As better illustrated in FIG. 2A, the one or more hinges 110 allow the one or more arm members 115 to move with respect to one another or move with respect to the base member 112. For instance, the one or more hinges allow the one or more arm members 115 to move from a first position 120 to a second position 122. In some aspects, in the second position 122, the second ends 117 and 113 of the one or more arm members 115 are closer together as compared to the first position 120. While not shown, the one or more hinges 110 may allow the one or more arm members 115 to contact each other. It should be appreciated that allowing the one or more arm members 115 to contact one another may improve the overall impact resistance of the frame as the impact force can be dampened or distributed.

The one or more hinges 110 may also allow the one or more arm members 115 to move to a third position 124. In the third position 124, the second ends of the one or more arm members 115 are moved further away from each other as compared to the first position 120. As described in greater detail below, the head-mounted display system 100 may be biased toward the first position 120.

Figure 2A:
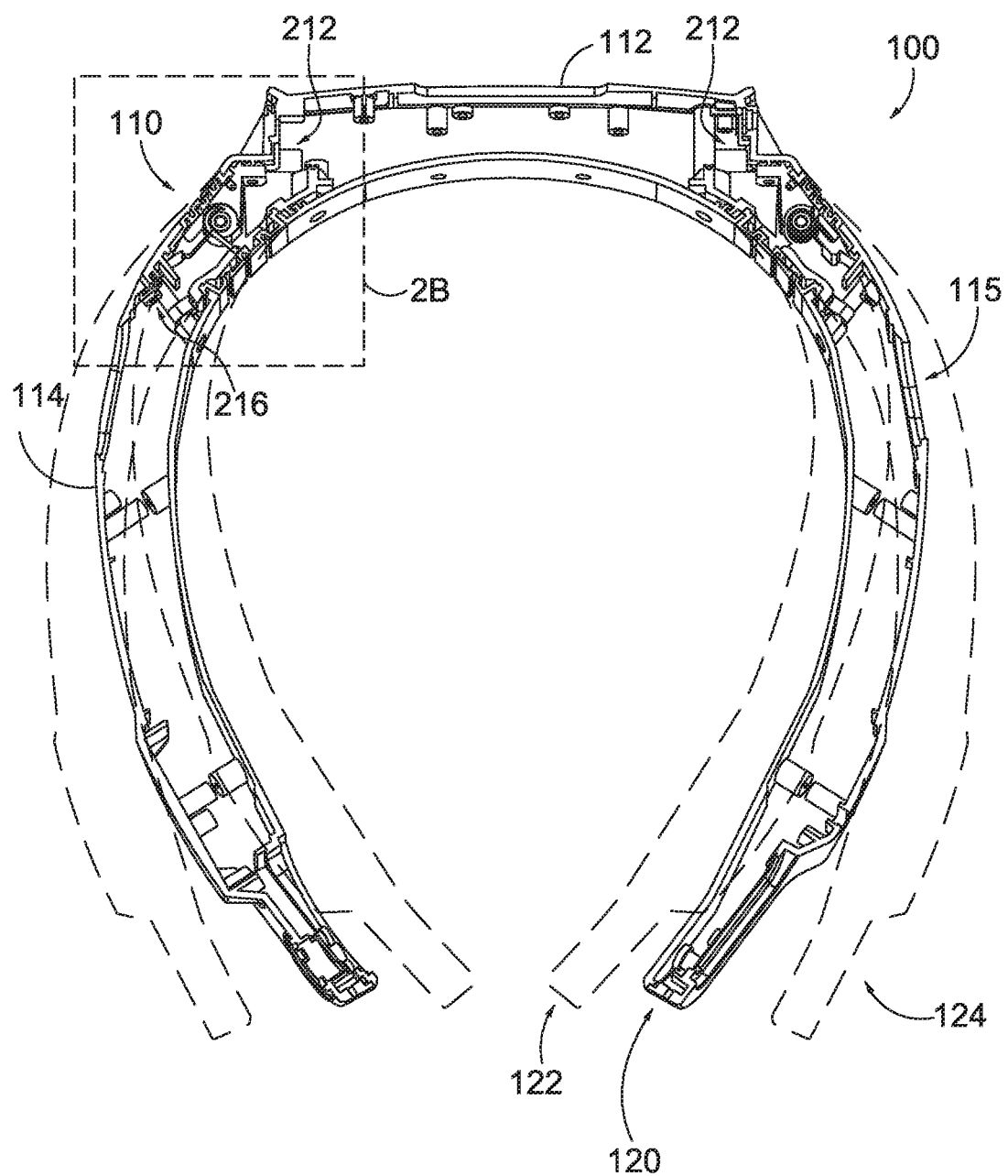
FIG. 2A is a cross-sectional, perspective view with portions removed to show an internal portion of the head-mounted display system of FIGS. 1A-B, in accordance with an embodiment of the present technology.

FIG. 2A is a cross-sectional, perspective view of an internal portion of the head-mounted display system 100 of FIG. 1A, in accordance with an embodiment of the present technology. As illustrated, the base member 112 includes one or more base chambers 212. While not shown, the one or more base chambers 212 may house various electronic components. The one or more arm members 115 may also include one or more chambers. For instance, the first arm member 114 includes an arm chamber 216. As described in more detail below, the hinge 110 may provide interior wall portions that provide a passage that is in communication with the one or more base chambers 212 and the arm chamber 216. It should be appreciated that the passage through the hinge is maintained while the head-mounted display system 100 is in the first position 120, second position 122, and third position 124 to allow wiring to pass through the hinge.

Figure 2B:
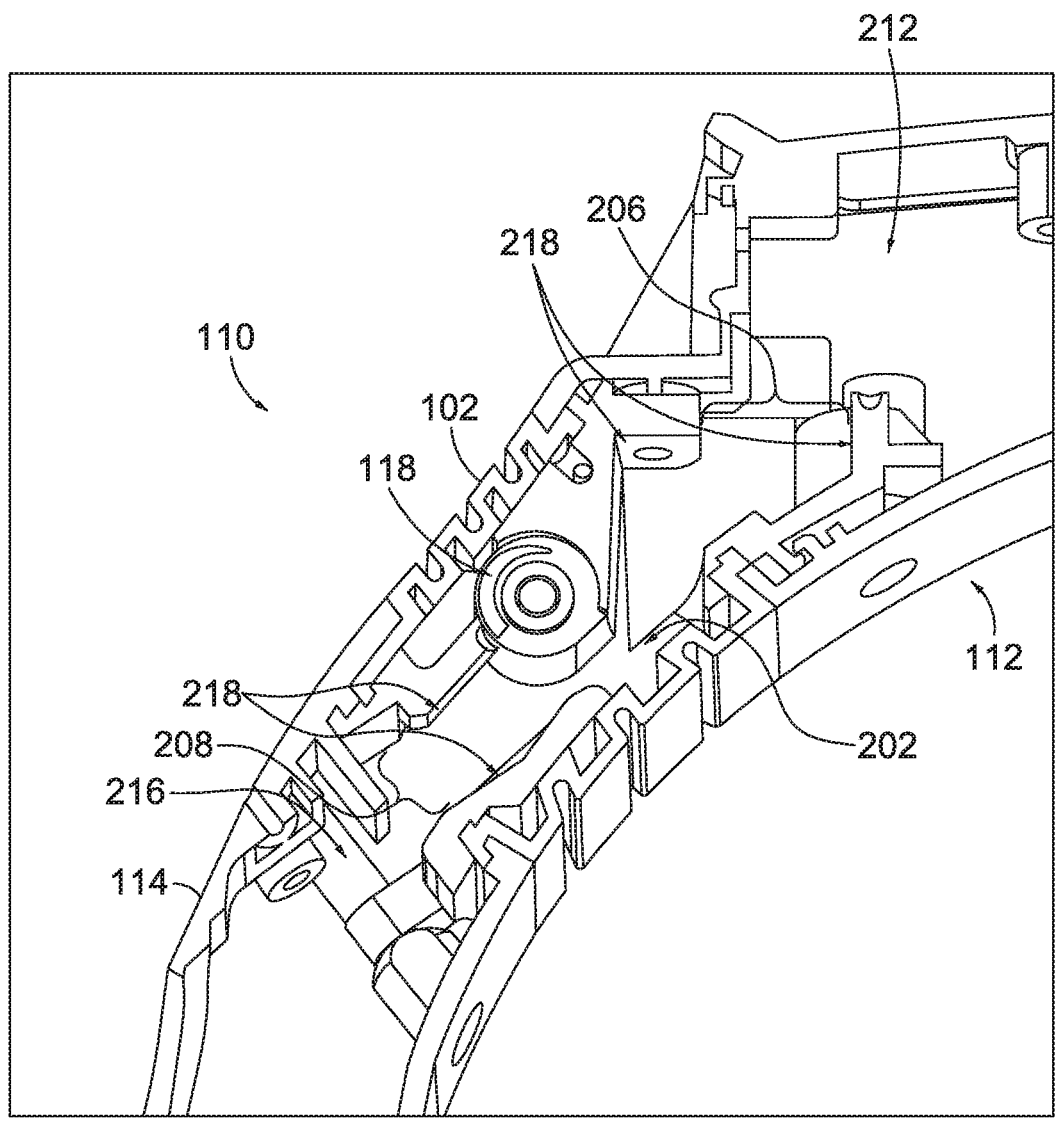
FIG. 2B is an enlarged view of area 2B in FIG. 2A, showing an enlarged view of the internal portion of the head-mounted display system of FIG. 2A, in accordance with an embodiment of the present technology.

FIG. 2B is an enlarged view of the internal portion of the hinge 110 of the head-mounted display system 100 of FIG. 1A, in accordance with an embodiment of the present technology. As mentioned, the hinge 110 may pivotally couple the base member 112 to the first arm member 114 while still providing a passage 202 through the hinge 110, thereby allowing wires to pass through the hinge 110. The passage 202 may be formed by interior walls 218 of the hinge 110. The interior walls 218 may be curved, straight, smooth, angled, or rounded so long as they form a passage within the interior portion of the hinge 110. As depicted, the passage 202 through the hinge 110 may open into the one or more base chambers 212 of the base member 112 via a first opening 206. The first opening 206 may be formed by an interior wall of the hinge 110 that opens toward the base member 112. Similarly, the passage 202 through the hinge 110 may open into the arm chamber 216 via a second opening 208. The second opening 208 may be formed by an interior wall of the hinge 110 that opens toward the first arm member 114.

The hinge 110 may be a modular component that is formed separately from the head-mounted display system 100. As such, in some aspects, the hinge 110 may be coupled to the base member 112 or the one or more arm members 115 via one or more attachment mechanisms. By way of example the one or more attachment mechanisms may be one or more of screw-based elements, male-female connectors, adhesives, straps, clips, elastically deformable elements, buttons, hooks, or hook-and-loop fasteners. Alternatively, the hinge 110 may be integral to the head-mounted display system 100, such as through integrally forming the hinge 110 with the one or more arm members 115 and/or base member 112 (e.g., through a molding process).

In some aspects, the hinge 110 comprises a biasing member 118. The biasing member 118 may be any mechanism or tensioning element for biasing the hinge toward a particular position. In some aspects, the biasing member 118 may be a torsional spring. Referring to FIG. 2A, for example, the biasing member 118 may bias the one or more arm members 115 toward the first position 120 after being displaced to the second position 122. Likewise, the biasing member 118 may bias the one or more arm members 115 toward the first position 120 after being displaced to the third position 124. The interior walls 218 may be located such that the passage 202 through the hinge 110 is maintained despite the hinge 110 being in the first position 120, second position 122, or third position 124.

While described in further detail below, the hinge system may further comprise a hinge cover 102. The hinge cover 102 generally fits over the hinge 110 so as to surround at least a portion of the hinge 110. The hinge cover 102 may be a flexible member that expands and contracts as the one or more arm members 115 move with respect to the base member 112. In some aspects, the hinge cover 102 prevents external elements (e.g., dust or moisture) from entering the interior portions of the hinge 110 (e.g., the passage 202, arm chamber 216, or one or more base chambers 212). In some aspects, the hinge cover 102 may comprise one or more walls forming a top-side face, bottom-side face, front-side face, and rear-side face of the hinge 110. The walls of the hinge cover 102 may form openings at the ends of the cover, such as where the hinge 110 couples to the base member 112 or one or more arm members 115, as explained in greater detail below.

Figure 3A:
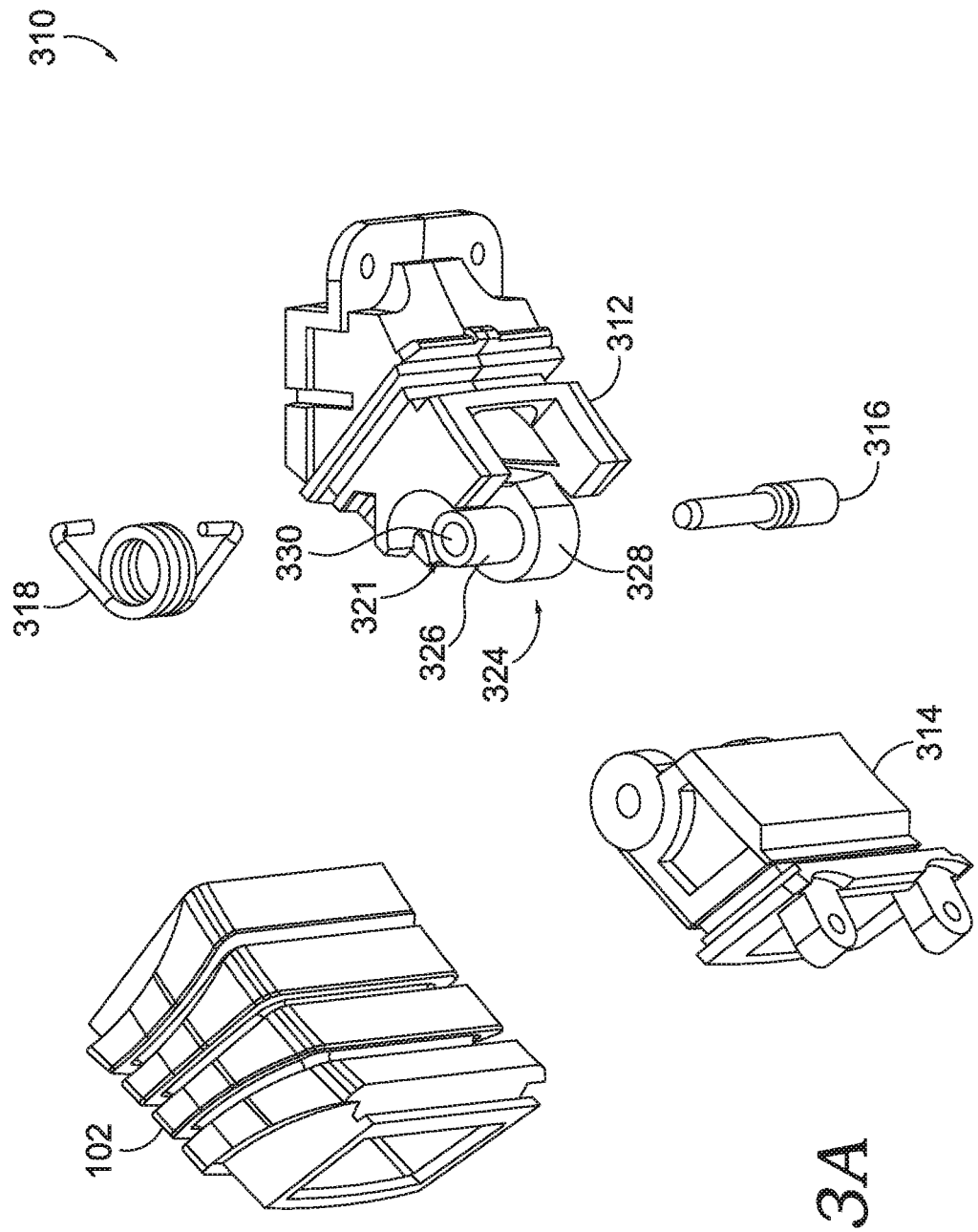
FIG. 3A is a first perspective of an exploded view of the hinge system for the head-mounted display system, in accordance with embodiments of the present technology.
Figure 3B:
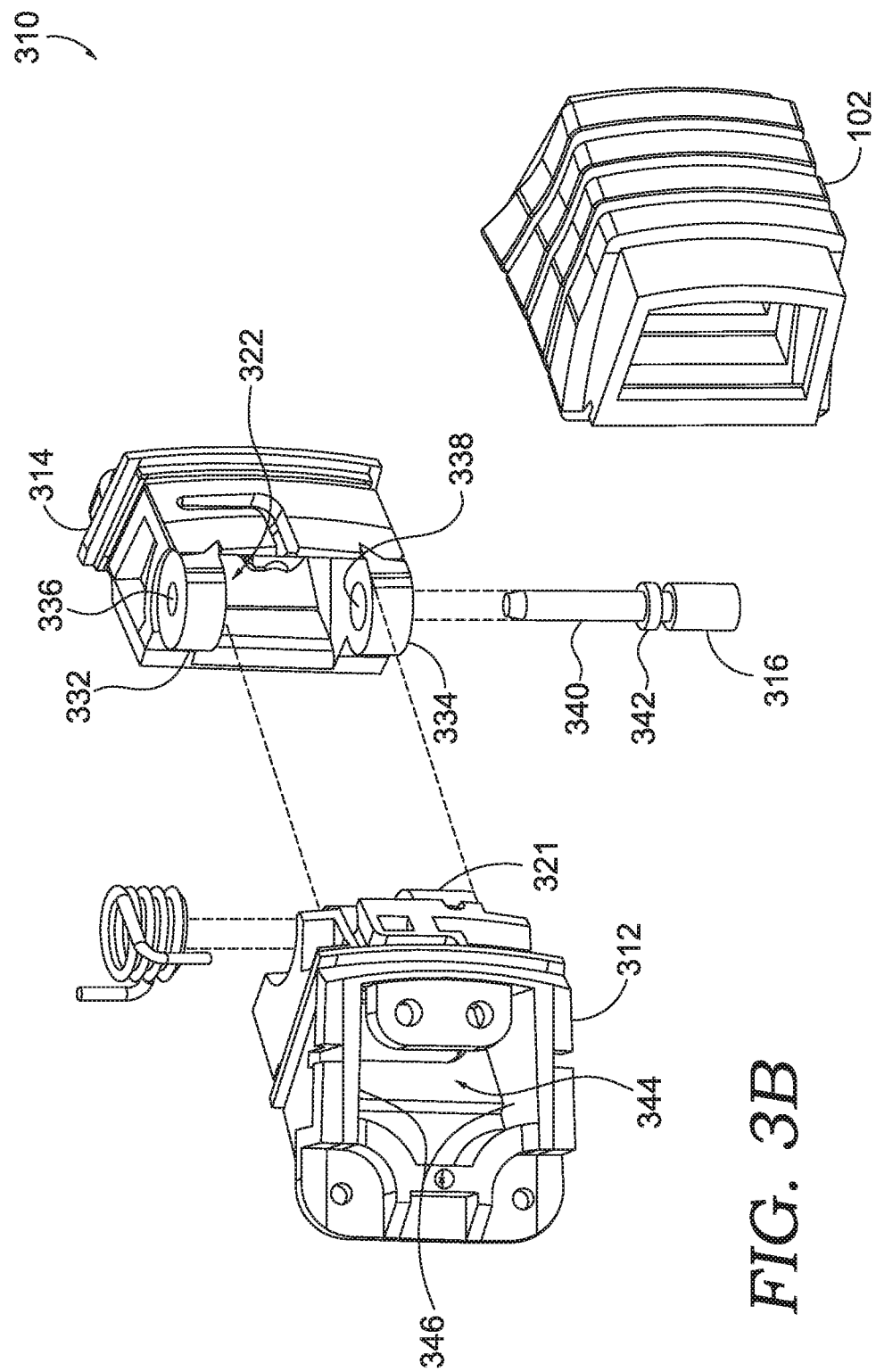
FIG. 3B is a second perspective of an exploded view of the hinge system for the head-mounted display system of FIG. 3A, in accordance with an embodiment of the present technology.
Figure 3C:
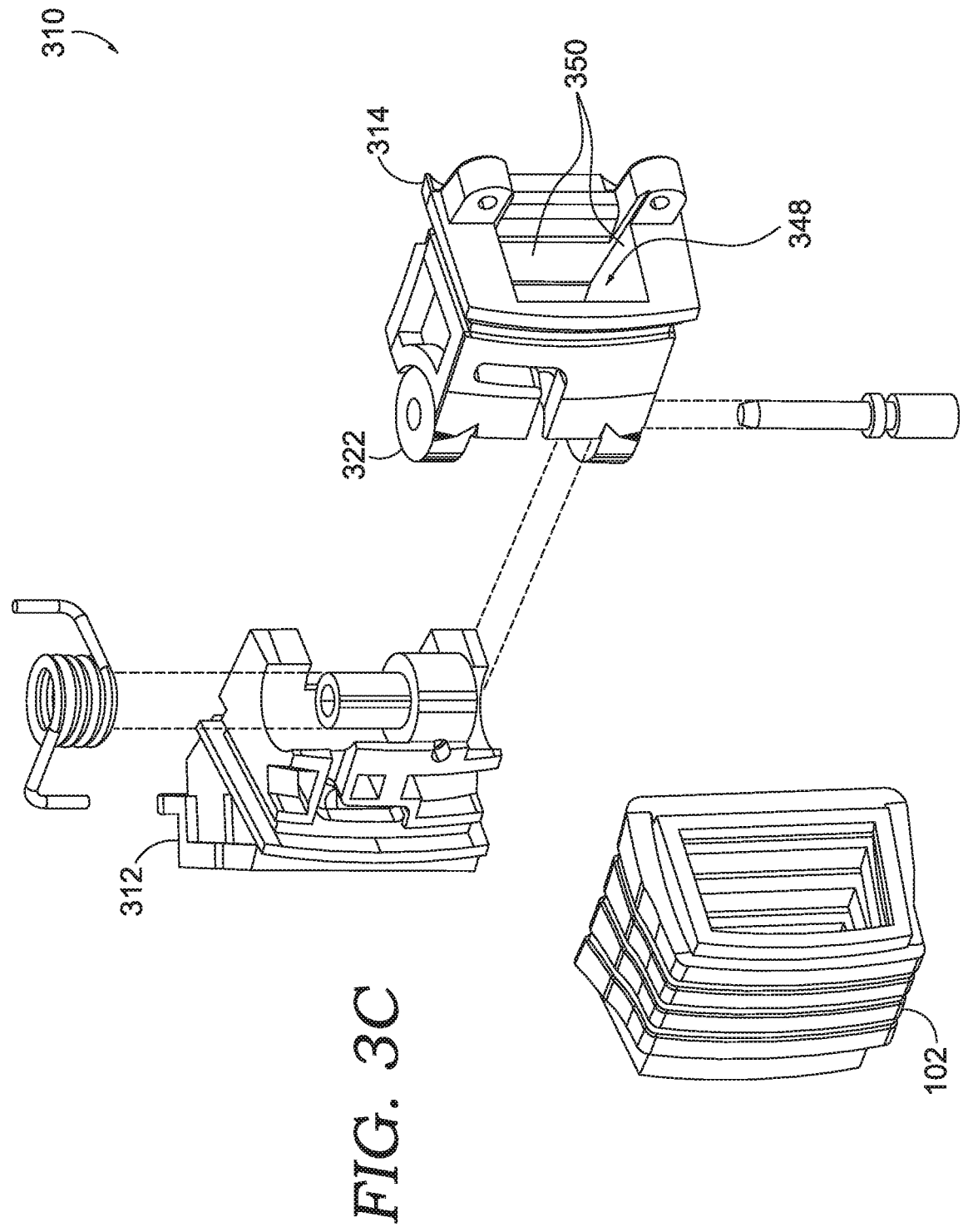
FIG. 3C is an third exploded view of the hinge system for the head-mounted display system of FIG. 3A, in accordance with an embodiment of the present technology.

FIGS. 3A-C are exploded views of a hinge system 310 taken from alternative perspectives, in accordance with embodiments of the present technology. Referring to FIG. 3A, the hinge system 310 includes a first hinge member 312 that mates with a second hinge member 314. In some aspects, the first hinge member 312 may couple to a base member, such as the base member 112, via an attachment mechanism. Additionally, the second hinge member 314 may couple to an arm member, such as the first arm member 114, via an attachment mechanism. The hinges system 310 may further include the hinge cover 102 that fits over the first hinge member 312 and the second hinge member 314.

The first hinge member 312 may include a first pin housing 321. The first pin housing 321 includes a protrusion 324 having a bore 330 extending therethrough that receives a pin 316. The protrusion 324 may comprise a first portion 326 and a second portion 328. In some aspects, the first portion 326 and the second portion 328 have different dimensions (e.g., width or diameter). In some aspects, a biasing member 318 fits over at least one of the first portion 326 or second portion 328. For instance, the first portion 326 may comprise a smaller outer surface dimension (e.g., width or diameter) with respect to the outer surface dimension (e.g., width or diameter) of the second portion 328. The biasing member 318 (such as a torsional spring) may be received over the first portion 326 of the protrusion 324 and fit adjacent to the second portion 328.

Referring to FIG. 3B, the second hinge member 314 may comprise a second pin housing 322. The second pin housing 322 includes one or more tabs, such as a first tab 332 and a second tab 334. The first tab 332 may be spaced apart from the second tab 334 to form an opening therebetween. In some aspects, the first pin housing 321 is received between the opening between the first tab 332 and the second tab 334. The one or more tabs (332, 334) may include a bore extending therethrough (e.g., a first bore 336 and a second bore 338) that receives the pin 316. When the first hinge member 312 and second hinge member 314 are mated, the pin 316 may extend through the first pin housing 321 and the second pin housing 322.

The pin 316 includes a first portion 340 having a different dimension than the dimension of a second portion 342. For instance, the second portion 342 may have a larger diameter than the first portion 340. Additionally, the first bore 336 and second bore 338 may be adapted to receive the varying diameters of the pin 316. For example, the second bore 338 may have a larger diameter than a diameter of the first bore 336. It should be appreciated that the varying diameters of the pin and the varying diameter of the bores may strengthen the coupling between the first hinge member 312 and second hinge member 314, which may be prone to breaking due to impact force experienced when the frame is dropped or due to the movement of the hinge 110 when the head-mounted display system 100 is donned and doffed by a user. Further, the variation in diameters may help a user or factory worker identify how the pin 316 is inserted into the hinge 110.

As illustrated in FIG. 3B, the first hinge member 312 includes a first passage 344 extending therethrough. The first passage 344 is formed by interior walls 346 of the first hinge member 312. The first passage 344 allows wires to pass through the first hinge member 312. Additionally, the first passage 344 may circumvent the first pin housing 321 (which is better illustrated in FIG. 4D). For instance, the interior walls 346 may be positioned such that the first passage 344 is offset from the first pin housing 321. As such, any wiring that extends through the first hinge member 312 may circumvent the first pin housing 321.

Referring to FIG. 3C, the second hinge member 314 includes a second passage 348 extending therethrough. The second passage 348 is formed by interior walls 350 of the second hinge member 314. The second passage 348 may allow wires to pass through the second hinge member 314. In some aspects, the second passage 348 may circumvent the second pin housing 322 (which is better illustrated in FIG. 4D). For instance, the interior walls 350 may be positioned such that the second passage 348 are offset from the second pin housing 322. As such, any wiring that extends through the second hinge member 314 may circumvent the second pin housing 322.

Continuing, when the first hinge member 312 is mated with the second hinge member 314, the first passage 344 and the second passage 348 is offset from the first and second pin housing 321, 322. As such, any wiring extending through the hinge may circumvent the first and second pin housing 321, 322. It should be appreciated that the first passage 344 and the second passage 348 may be maintained despite the first hinge member 312 moving with respect to the second hinge member 314.

Figure 4A:
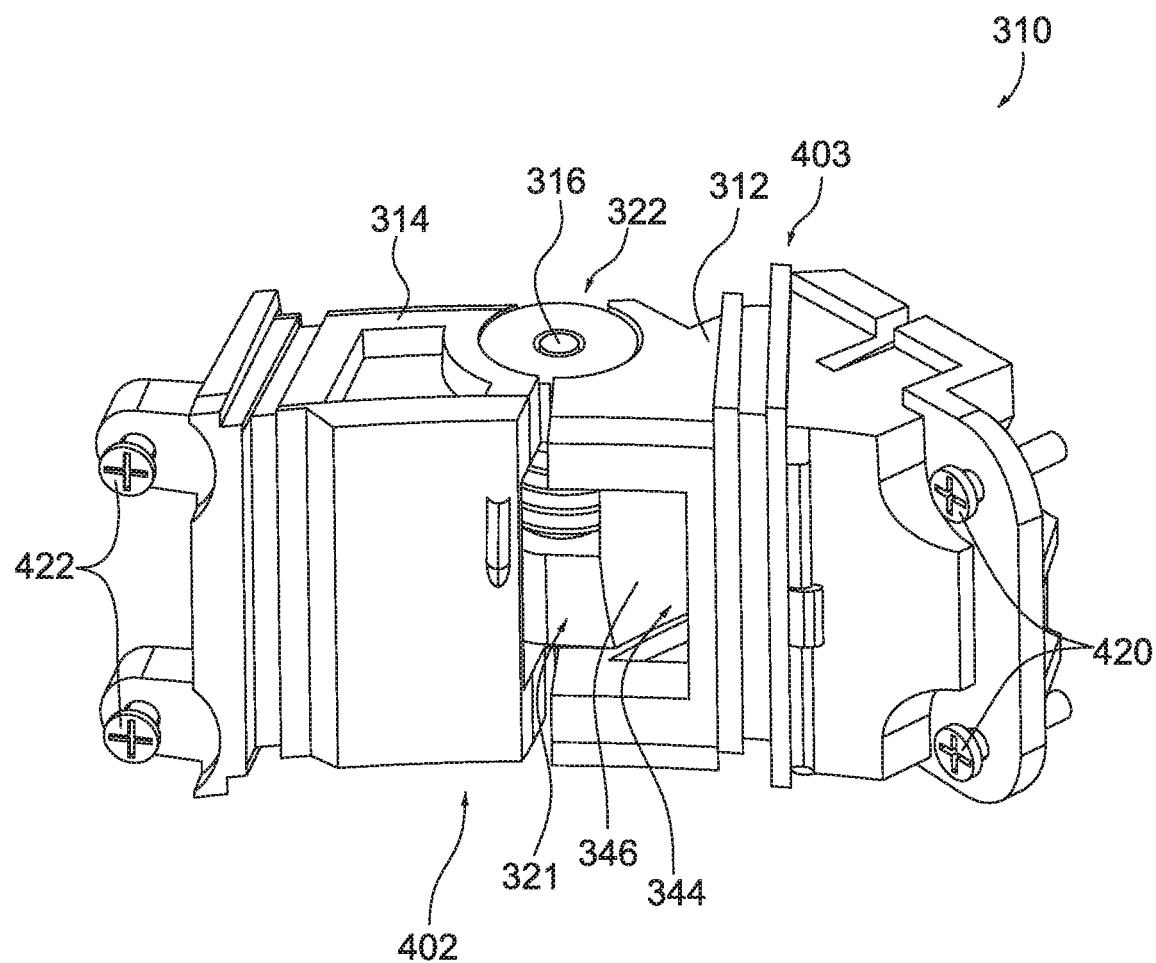
FIG. 4A is an assembled view of an interior face of the hinge system of FIG. 3A, in accordance with embodiments of the present technology.

FIG. 4A is an assembled view of the hinge system 310 of FIG. 3A from a first perspective of an inner-facing side 402, in accordance with embodiments of the present technology. In particular, FIG. 4A is taken from the perspective that illustrates the inner-facing side 402, which may correspond to a portion of the frame that faces a wearer's head. Similar to FIG. 3A, the hinge system 310 comprises the first hinge member 312 that mates with the second hinge member 314. The first pin housing 321 may mate with the second pin housing 322 such that the pin 316 is received by both the first pin housing 321 and the second pin housing 322. The first hinge member 312 may thus be pivotally coupled to the second hinge member 314. For the sake of clarity, FIG. 4A does not include a hinge cover, such as hinge cover 102.

As described above with respect to FIG. 1A, the first arm member 114 and the base member 112 may be coupled together via the hinge 110. In some aspects, the hinge system 310 couples the first arm member 114 to the base member 112. For example, the first hinge member 312 may be coupled to the base member 112 via an attachment mechanism 420 (e.g., screw, pin, adhesive, clip, or button). Similarly, the second hinge member 314 may be coupled to the first arm member 114 via an attachment mechanism 422 (e.g., screw, pin, adhesive, clip, or button). The attachment mechanisms 420, 422 may reverseably couple the arm members 115 to the base member 112. As such, the hinge system 310 may be a modular component that is distinct from the first arm member 114 and the base member 112. For example, the hinge system 310 may be formed separately from the first arm member 114 and the base member 112. Because the hinge system 310 may break when the head-mounted display system 100 experiences a large impact force, the modularity of the hinge system 310 allows it to be replaced without replacing the first arm member 114 or the base member 112.

Figure 4B:
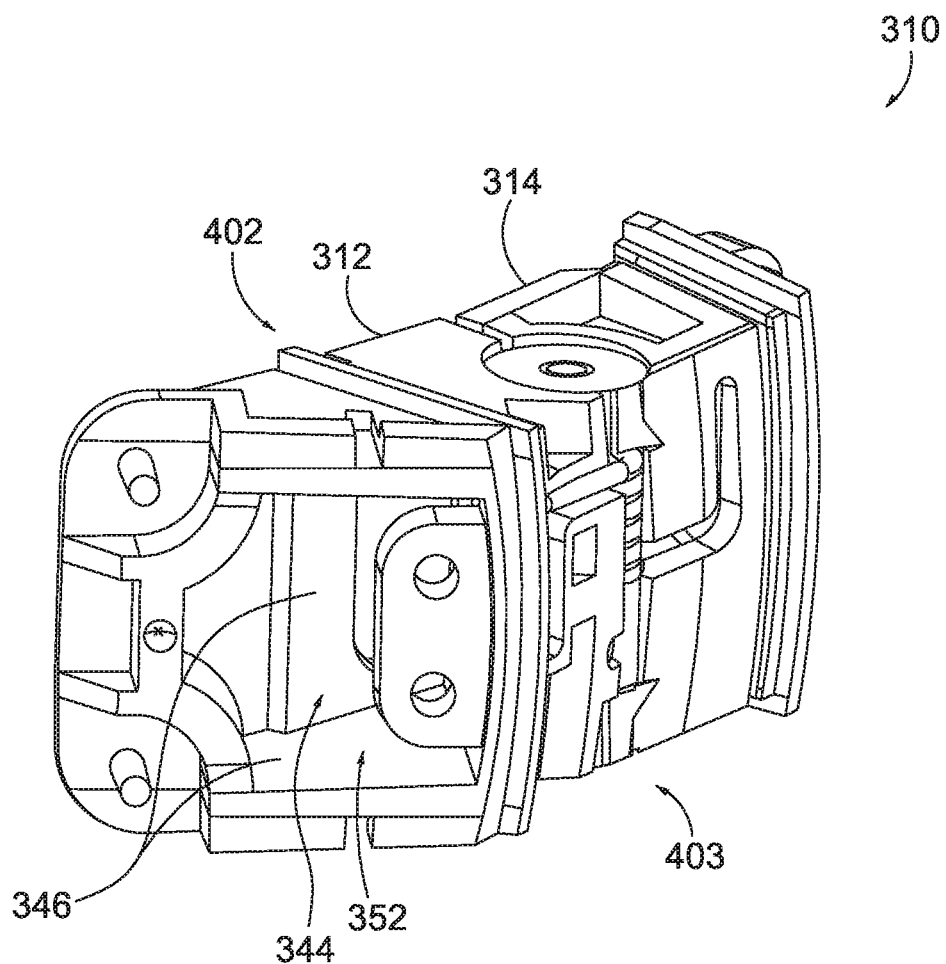
FIG. 4B is an assembled view of an exterior face of the hinge system of FIG. 3A, in accordance with embodiments of the present technology.

FIG. 4B is an alternative assembled view of the hinge system 310 of FIG. 3A, taken from a second perspective of an outer-facing side 403, in accordance with embodiments of the present technology. In particular, FIG. 4B is taken from the perspective that illustrates an exterior face, which may correspond to a portion of the frame that faces away from a wearer's head. Similar to FIG. 3A, the hinge system 310 comprises the first hinge member 312 that mates with the second hinge member 314. The first hinge member 312 includes the interior walls 346 that form the first passage 344. The interior walls 346 may form a first opening 352 (such as the first opening 206 of FIGS. 2A-B) that opens to a chamber associated with the base member 112 (such as the one or more base chambers 212 of FIGS. 2A-B). For the sake of clarity, FIG. 4B does not include a hinge cover, such as hinge cover 102.

Figure 4C:
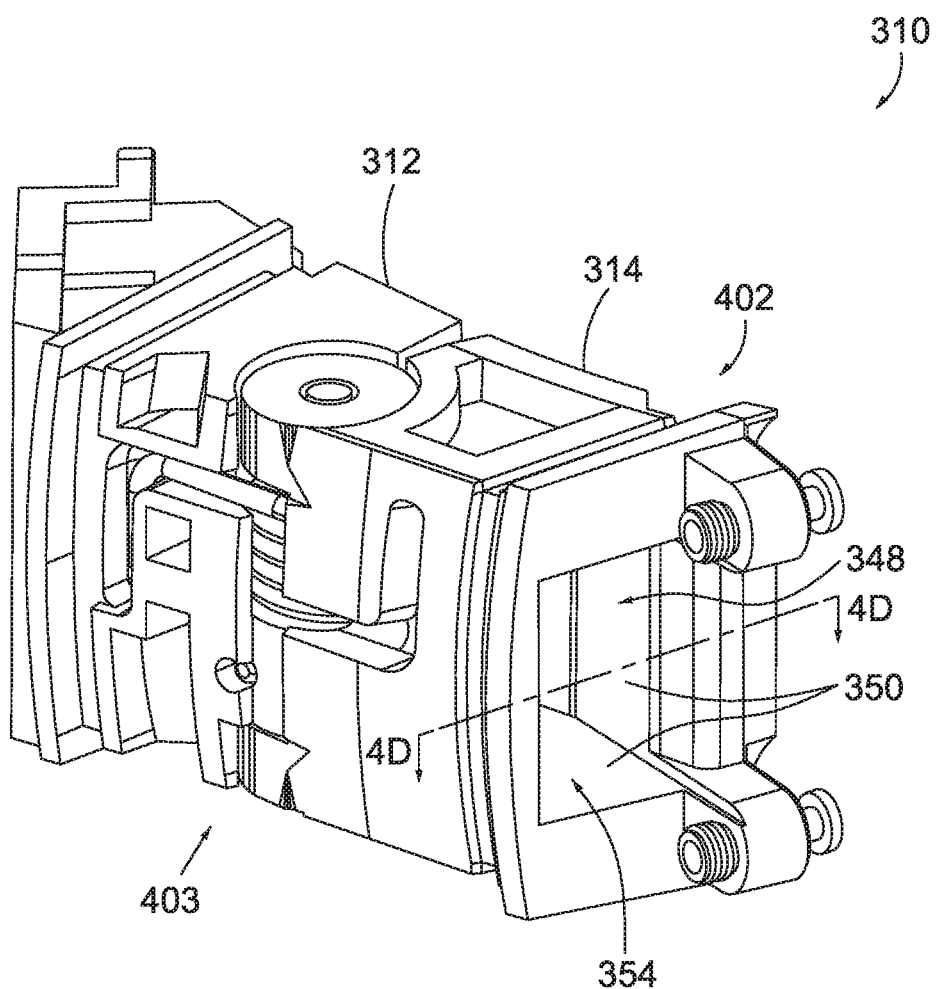
FIG. 4C is an assembled view of the exterior face of the hinge system of FIG. 3A, in accordance with embodiments of the present technology.

FIG. 4C is an assembled view of the exterior face 204 of the hinge system 310 of FIG. 3A taken from a third perspective of the outer-facing side 403, in accordance with embodiments of the present technology. Similar to FIG. 3A, the hinge system 310 comprises the first hinge member 312 that mates with the second hinge member 314. The second hinge member 314 may include the interior walls 350 that form the second passage 348. The interior walls 350 may form a second opening 354 (such as the second opening 208 of 2A-B) that opens to a chamber associated with an arm member (such as the arm chamber 216 of FIGS. 2A-B). For the sake of clarity, FIG. 4C does not include the hinge cover, such as hinge cover 102.

Figure 4D:
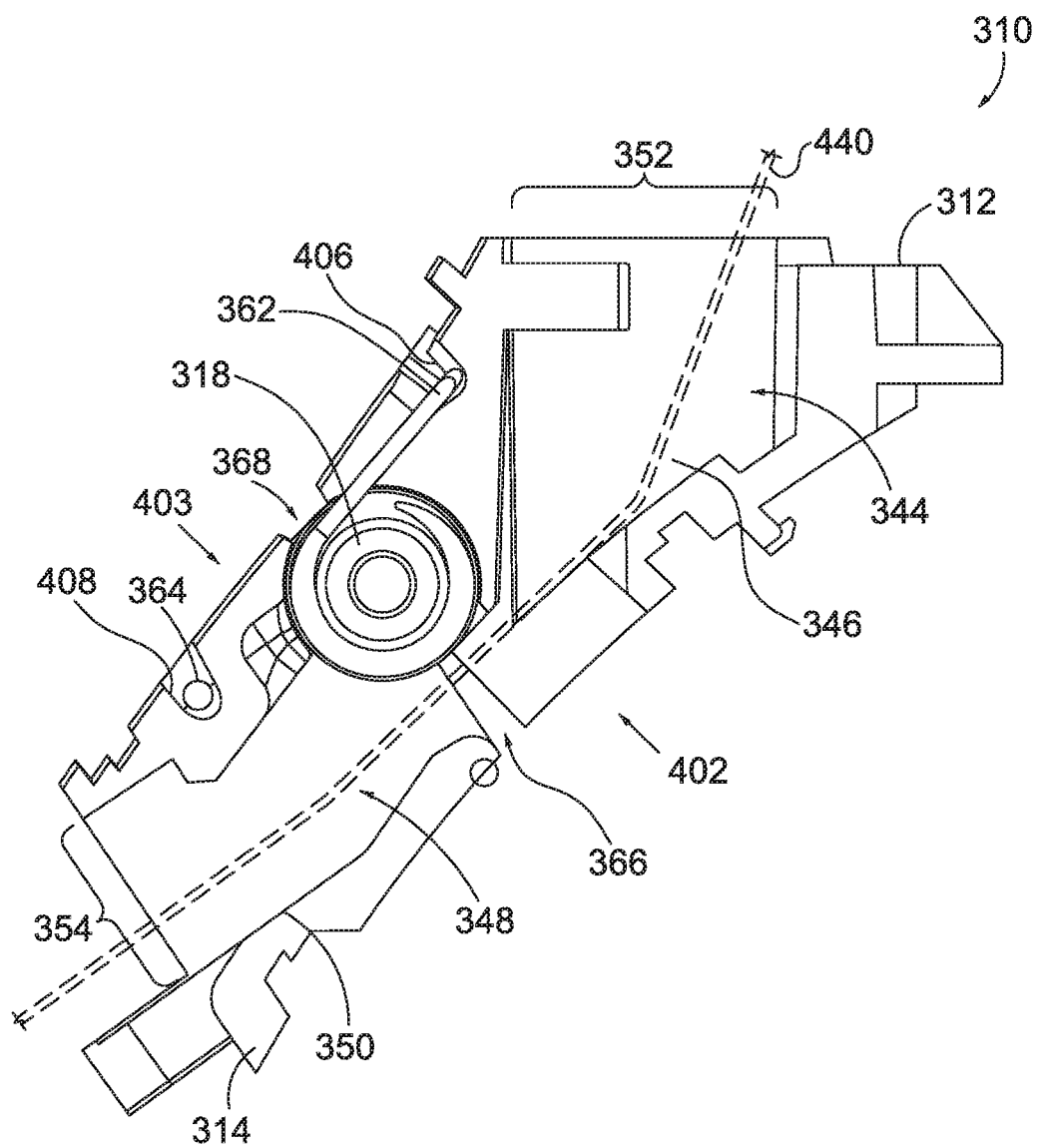
FIG. 4D is a top, cross-sectional, assembled view of the hinge system of FIG. 3A taken along cut line 4D-4D of FIG. 4C, in accordance with embodiments of the present technology.

FIG. 4D is a top, cross-sectional, assembled view of the hinge system 310 of FIG. 3A taken along line 4D-4D of FIG. 4C, in accordance with embodiments of the present technology. Similar to FIG. 3A, the hinge system 310 comprises the first hinge member 312 that mates with the second hinge member 314. As described, the first hinge member 312 couples to base member 112 while the second hinge member 314 couples to arm member 114.

As described above, the first hinge member 312 has interior walls 346 that form the first passage 344. The interior walls 346 may further form the first opening 352 that opens to a chamber associated with base member 112. Similarly, the second hinge member 314 has interior walls 350 that form the second passage 348. The interior walls 350 may further form the second opening 354 that opens to a chamber associated with arm member 114. Element 440 illustratively depicts wiring extending through the first passage 344 and second passage 348.

In some aspects, the biasing member 318 is a tensioning element. The tensioning element may be any element that biases the first hinge member 312 and the second hinge member 314 to a particular position. As shown in FIG. 4D, the biasing member 318 is a torsional spring having a first end 362 and a second end 364. In some aspects, the first end 362 may be configured to engage the first hinge member 312. For instance, the first end 362 may fit into a slot 406 on the first hinge member 312. The second end 364 may engage the second hinge member 314. For instance, the second end 364 may fit into a slot 408 on the second hinge member 314. As the hinge system moves away from a resting position, the biasing member 318 may bias the first hinge member 312 and second hinge member 314 back toward the resting position.

To allow the first hinge member 312 to move with respect to the second hinge member 314, the walls of the first hinge member 312 and second hinge member 314 may provide a first gap 366 between the first hinge member 312 and the second hinge member 314. For example, the interior gap 366 may be formed between the walls of the first hinge member 312 and the walls of second hinge member 314 on the inner-facing side 402. Referring to FIG. 2A, the first gap 366 may allow the head-mounted display system 100 to move from the first position 120 to the second position 122.

Continuing, the walls of the first hinge member 312 and second hinge member 314 may provide a second gap 368 between the first hinge member 312 and the second hinge member 314. For example, the second gap 368 may be formed between the walls of the first hinge member 312 and the walls of second hinge member 314 along the outer-facing side 403. Referring to FIG. 2A, the second gap 368 may allow the head-mounted display system 100 to move from the first position 120 to the third position 124. In some aspects, the first gap 366 is spaced apart from the second gap 368 by the biasing member 318 and/or the first and second pin housing 321, 322.

Figure 5A:
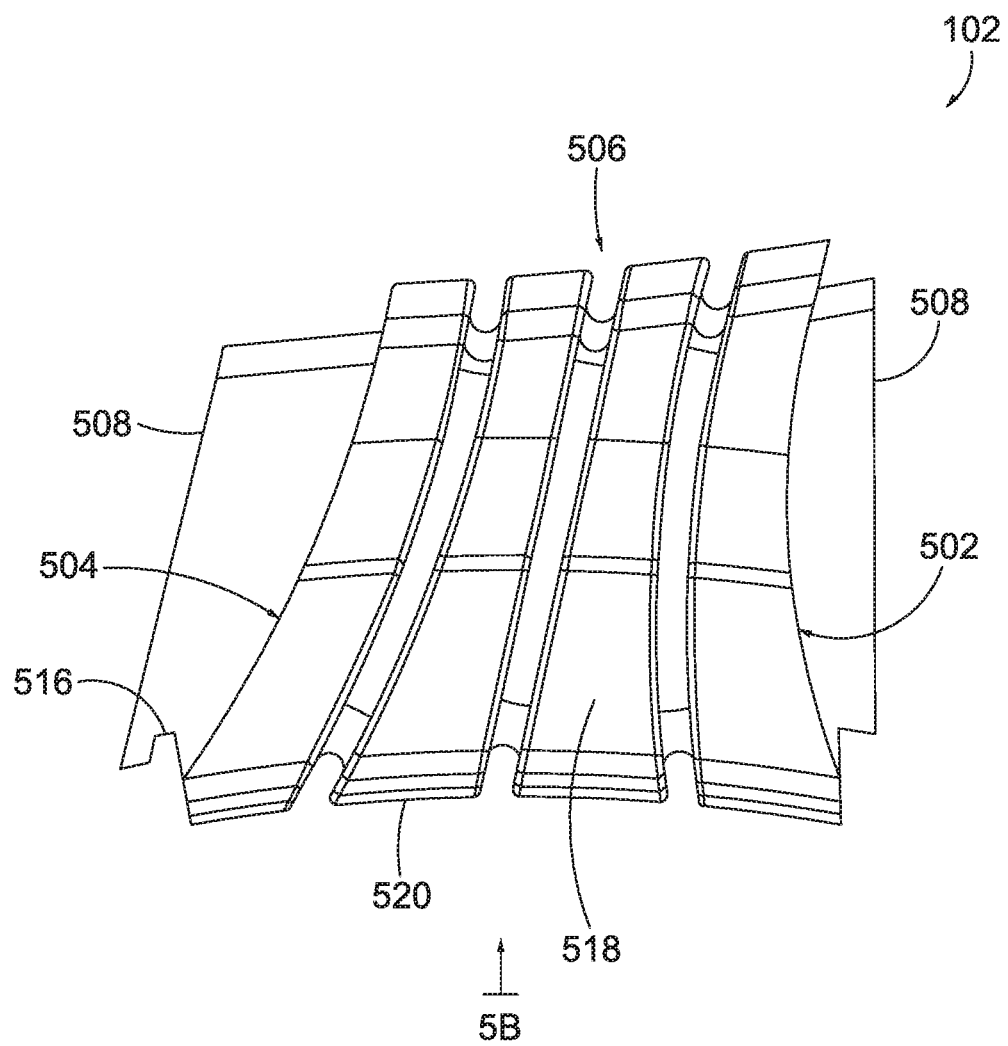
FIG. 5A is a top view of a hinge cover for a hinge system, in accordance with embodiments of the present technology.
Figure 5B:
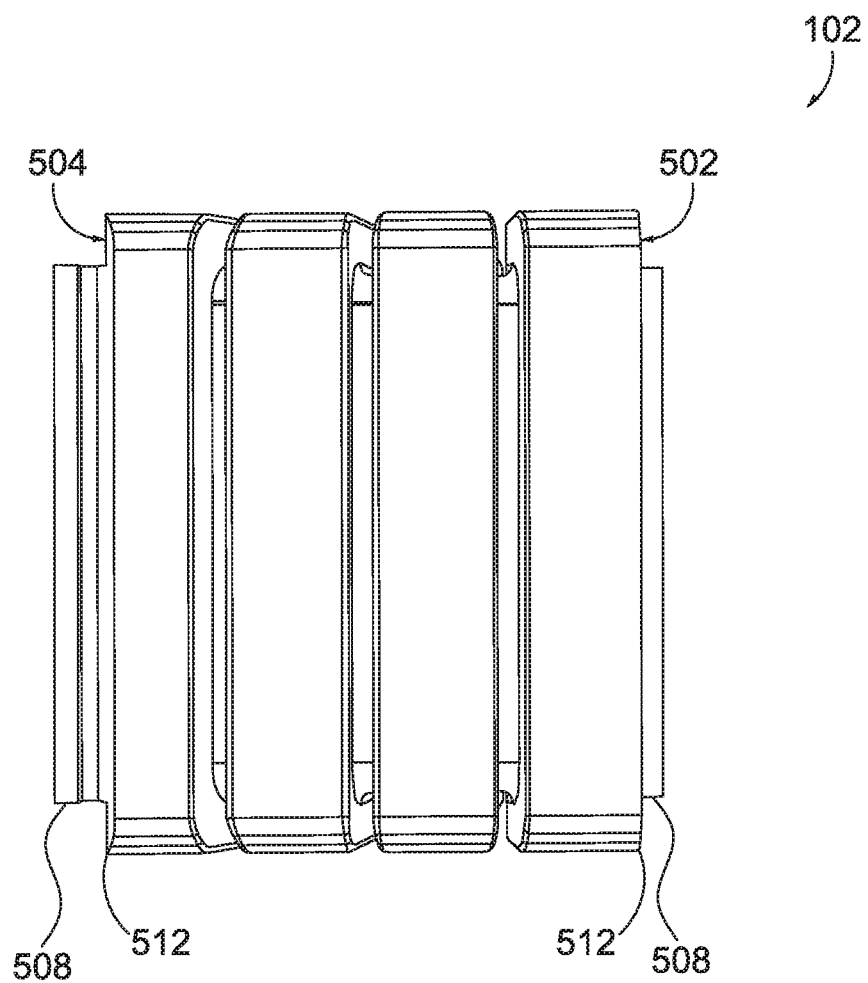
FIG. 5B is a side view of the hinge cover of FIG. 5A, in accordance with embodiments of the present technology.

FIGS. 5A-B are a top and side view of hinge cover 102 for a hinge system, in accordance with embodiments of the present technology. The hinge cover 102 may include a body 518 extending from a first face 502 to a second face 504. The body 518 may include one or more sides 506 that extend longitudinally from the first face 502 to the second face 504. The body 518 may have a polygonal, circular, rectangle, square, or elliptical cross-section. As shown in FIGS. 5A-B, in some aspects, the hinge cover 102 has a substantially rectangular cross-section.

The interior walls of the body 518 may form a hollow interior that receives a hinge system, such as the hinge system 310 of FIG. 3. For instance, the hinge cover 102 may have a hollow interior formed by interior walls of the body 518. The hollow interior of the body 518 may thus receive the hinge system while the hinge cover 102 is slid onto or over the hinge. When assembled, the hinge cover 102 may enclose at least a portion of the hinge system. By way of example, the one or more sides 506 may enclose a corresponding portion of the hinge system when the hinge cover 102 is slid into position. As can be seen in FIG. 1A, the head-mounted display system 100 includes a hinge cover 102 that encloses the hinge 110. It is contemplated that the body 518 may comprise one or more ribbed portions 520. In some aspects, the one or more ribbed portions 520 include alternating channels and ridges on at least one of the outer or inner surfaces of the body 518, or both.

In some aspects, the hinge cover 102 may include a lip 508 extending from a first face 502 and/or a second face 504. The lip 508 may be any type of protrusion that extends away from the first face 502 and/or second face 504. For example, the lip 508 may be a straight, angled, or curved protrusion. In some aspects, the lip 508 is located along substantially all of a perimeter or circumference of the first face 502 and/or the second face 504.

Figure 6:
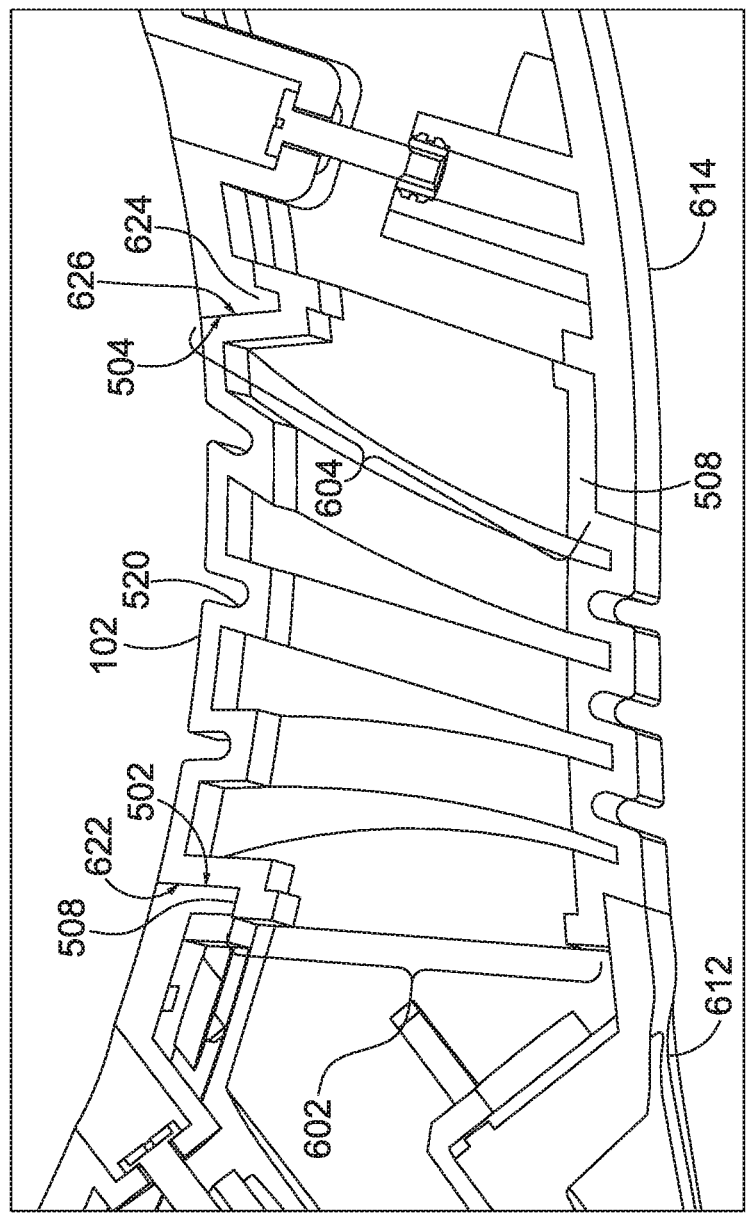
FIG. 6 is a top, cross-sectional view of the hinge cover of FIG. 5A when the hinge cover is positioned in an as-used configuration with a head-mounted display system, in accordance with embodiments of the present technology.

The lip 508 overlaps with a portion of an arm member or base member, such as the first arm member 114 or base member 112 of FIG. 1A. The lip 508 may overlap along an interior or exterior portion of the arm or base member. As shown in FIG. 6, the lip 508 overlaps along an interior portion of the arm and base member. In some aspects, the lip 508 may be positioned between the hinge member 110 and the arm member 614 or base member 612. This allows the hinge cover 102 to be held in place. Alternatively, it is contemplated that the lip 508 may overlap an exterior portion of an arm member or a base member.

Referring to FIG. 5B, the lip 508 may be located anywhere along the first face 502 and/or the second face 504. In some aspects, the lip 508 may be offset from an outer edge 512 of the hinge cover 102. By offsetting the lip 508, the lip 508 may be received into an opening by an arm member or base member, such as the first arm member 114 or base member 112 of FIG. 1. As shown in FIG. 6, one or more portions of the lip 508 may be received into an opening 602 of a base member 612. One or more portions of the lip 508 may be also be received into an opening 604 of an arm member 614. It should be appreciated that the lip 508 may assist in protecting the internal components (e.g., circuitry, computer processor) of a modular head-mounted display system from external elements (e.g., dust or moisture).

In some aspects, the lip 508 and a modular component (e.g., the arm or base member) may include corresponding grooves to secure the hinge cover 102 to the modular component. The corresponding grooves may include an indentation and/or a protrusion. Referring to FIG. 5A, the hinge cover 102 comprises an indentation 516 on a surface of the lip 508 that mates with a protrusion of a modular component. For instance, as shown in FIG. 6, the arm member 614 includes a protrusion 624 extending inward from an interior wall of the arm member 614. When assembled, the corresponding grooves (e.g., indentation and protrusion) assist in securing the body 518 of the hinge cover 102 to the modular head-mounted display system. These corresponding grooves also provide an additional barrier that prevents dust and moisture from entering into the internal chambers of a modular head-display system.

In some aspects, the hinge cover 102 may be made of a flexible material. For instance, the hinge cover 102 may be made of rubber, silicone, or any other similar material. The flexible material aids in allowing the hinge cover 102 to adjust to the different positions as one or more arm members move with respect to a base member. In some aspects, the hinge cover 102 may be formed to be a single component. For example, the hinge cover 102 may be formed through a molding process. Alternatively, the hinge cover 102 may comprise multiple components that are coupled or attached to one another.

FIG. 6 illustrates a top, cross-sectional view of the hinge cover 102 of FIG. 5 when the hinge cover 102 is positioned in an as-used configuration 600 with a head-mounted display system in accordance with embodiments of the present technology. For the sake of clarity, the hinge is not depicted. As mentioned, the hinge cover 102 may include alternating channels and ridges on both the outer or inner surfaces of the body 518. As illustrated, the hinge cover 102 has a cross-sectional area that varies along the longitudinal axis. The one or more ribbed portions 520 may aid in the allowing the hinge cover 102 to flex as the hinge moves, such as when the arm member 114 moves with respect to the base member 112.

In the as-used configuration 600 (e.g., when the hinge cover 102 is slid into position over the hinge), the first face 502 may be positioned adjacent to a face 622 of a base member 612, such as base member 112 of FIG. 1A. In some aspects, the first face 502 abuts the face 622 of the base member 612 to prevent external elements (e.g., dust or moisture) from entering the interior chambers of the head-mounted display system. It is contemplated that, in some aspects, the first face 502 may be prevented from touching the face 622 of the base member 612 based on an intermediate sealing component.

Continuing, the second face 504 may be positioned adjacent to a face 626 of an arm member 614, such as first arm member 114 of FIG. 1A. In some aspects, the second face 504 abuts the face 626 of the arm member 614 to prevent external elements (e.g., dust or moisture) from entering the interior chambers of the head-mounted display system. It is contemplated that, in some aspects, the second face 504 may be prevented from touching the face 626 of the arm member 614 based on an intermediate sealing component.

Figure 7:
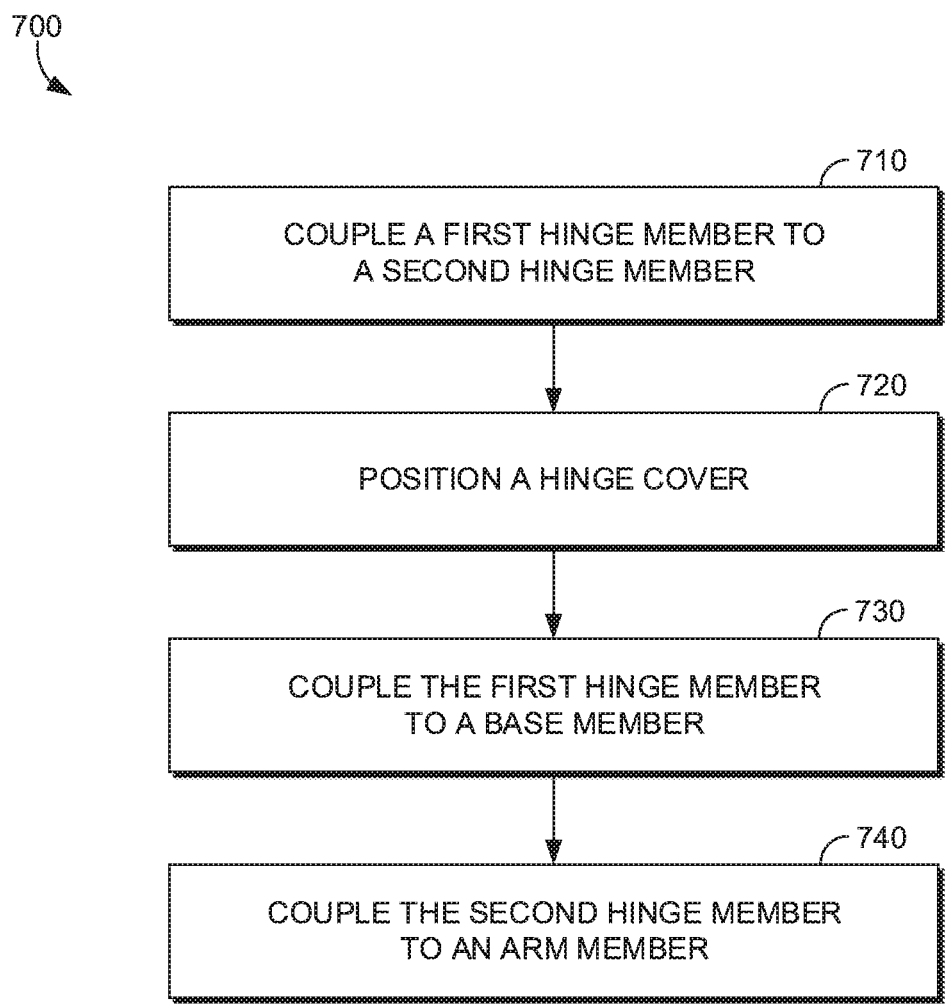
FIG. 7 is a flow diagram of an exemplary method of assembling a head-mounted display system, in accordance with embodiments of the present technology.

FIG. 7 is a flow diagram 700 of an exemplary method of assembling a head-mounted display system, in accordance with embodiments of the present technology. At block 710, a first hinge member, such as the first hinge member 312 of FIGS. 3A-4D, is coupled to a second hinge member, such as the second hinge member 314 of FIGS. 3A-4D. For instance, a first pin housing may be aligned with a second pin housing and a pin may be inserted into one or more bores, as described with respect to FIGS. 3A-4D. At block 720, a hinge cover, such as the hinge cover 102 of FIGS. 5-6, may be positioned over the first and second hinge member. At block 730, the first hinge member may be coupled to a base member, such as the base member 112 of FIG. 1. At block 740, the second hinge member may be coupled to an arm member, such as the first arm member 114 of FIGS. 1-2B. While not shown, flow diagram 700 may further include positioning a hinge cover so that it overlaps with the arm member or the base member, or a combination thereof.

Aspects of the present disclosure have been described with the intent to be illustrative rather than restrictive. Alternative aspects will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Not all steps listed in the various figures need be carried out in the specific order described.

What is claimed is:

1. A head-mounted display system, comprising:
an arm member having a distal end and a proximal end;
a display portion coupled to the distal end of the arm member;
a base member pivotally coupled to the proximal end of the arm member by a hinge, the hinge comprising a first hinge member that mates with a second hinge member, the first hinge member comprising an interior wall structure defining a first passage extending therethrough and including a first pin housing, and the second hinge member comprising an interior wall structure defining a second passage extending therethrough and including a second pin housing, wherein the second passage opens to the first passage;
a pin positioned in the first pin housing and in the second pin housing; and
a biasing member coupled to the first hinge member and to the second hinge member, wherein the biasing member comprises a torsional spring, and
wherein the torsional spring is coupled about the pin such that the torsional spring rotationally biases the first hinge member and the second hinge member.

2. The head-mounted display system of claim 1, further comprising a hinge cover that at least partially encloses the first hinge member and the second hinge member.

3. The head-mounted display system of claim 2, wherein the hinge cover comprises a lip that overlaps with at least one of the base member and the arm member.

4. The head-mounted display system of claim 3, wherein the torsional spring biases the hinge from a second position to a first position, and wherein the first passage opens to the second passage while the hinge is in the second position.

5. The head-mounted display system of claim 1, further comprising:
one or more chambers within the base member, wherein the first passage of the first hinge member opens to the one or more chambers of the base member; and
a chamber within the arm member, wherein the second passage of the second hinge member opens to the chamber of the arm member.

6. A hinge assembly for a head-mounted display, comprising:
a first hinge member comprising a first pin housing;
a second hinge member comprising a second pin housing, wherein the second pin housing mates with the first pin housing; and
a pin positioned in the first pin housing and in the second pin housing such that the first hinge member and the second hinge member rotate about the pin,
wherein the first hinge member has an interior wall structure defining a first passage extending therethrough, and
wherein the second hinge member has an interior wall structure defining a second passage extending therethrough, the second passage opening to the first passage; and
a torsional spring that is positioned about the pin such that the torsional spring rotationally biases the first hinge member and the second hinge member to a first position.

7. A frame for a head-mounted display, comprising:
a base member comprising a first end and a second end;
a first arm member comprising a proximal end that is pivotally coupled to the first end of the base member;
a second arm member comprising a proximal end that is pivotally coupled to the second end of the base member;
a pair of hinges pivotally coupling the first arm member to the base member and the second arm member to the base member, respectively, each hinge comprising:
a first hinge member that mates with a second hinge member,
wherein the first hinge member comprises an interior wall structure defining a first passage extending therethrough and includes a first pin housing, and
wherein the second hinge member comprises an interior wall structure defining a second passage extending therethrough and includes a second pin housing, wherein the second passage opens to the first passage; and
a pin positioned in the first pin housing and in the second pin housing; and
a pair of biasing members that bias the pair of hinges to a first position, wherein each biasing member comprises a torsional spring that is coupled about the corresponding pin such that it rotationally biases the corresponding first hinge member and the corresponding second hinge member about the corresponding hinge.

8. The frame for the head-mounted display of claim 7, further comprising a pair of hinge covers that at least partially enclose the pair of hinges.

9. The frame for the head-mounted display of claim 8, wherein the pair of hinge covers each comprise a lip that overlaps with at least one of the base member, the first arm member, and the second arm member.

10. The frame for the head-mounted display of claim 9, wherein the first passage opens to the second passage while the pair of hinges are in a second position, and wherein the pair of biasing members causes the pair of hinges to move from the second position to the first position.

11. The frame for the head-mounted display of claim 7, further comprising one or more chambers within the base member, wherein the first passage of the first hinge member opens to the one or more chambers of the base member.

12. The hinge assembly of claim 6, wherein the second pin housing comprises a first tab with a first bore and a second tab with a second bore, and wherein the first bore and the second bore receive the pin.

13. The hinge assembly of claim 6, further comprising a hinge cover that at least partially encloses the first hinge member and the second hinge member.

14. The hinge assembly of claim 6, wherein the first pin housing comprises a protrusion with a bore that receives the pin.

15. The hinge assembly of claim 14, wherein the protrusion comprises a first portion and a second portion of different dimensions, and wherein the torsional spring is received over the first portion and fits adjacent to the second portion.

16. The hinge assembly of claim 6, wherein the first hinge member fits at least partially within the second hinge member.

* * * * *